United States Patent
Chang et al.

(10) Patent No.: US 11,031,336 B2
(45) Date of Patent: Jun. 8, 2021

(54) SEMICONDUCTOR MEMORY DEVICE HAVING CONTACT ELEMENT OF RECTANGULAR SHAPE

(71) Applicant: Taiwan Semiconductor Manufacturing Co., Ltd., Hsinchu (TW)

(72) Inventors: Chao-Yuan Chang, New Taipei (TW); Jui-Lin Chen, Taipei (TW); Kian-Long Lim, Hsinchu (TW); Feng-Ming Chang, Hsinchu County (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 16/394,938

(22) Filed: Apr. 25, 2019

(65) Prior Publication Data
US 2020/0343185 A1  Oct. 29, 2020

(51) Int. Cl.
| | |
|---|---|
| *H01L 23/528* | (2006.01) |
| *H01L 27/11* | (2006.01) |
| *H01L 27/092* | (2006.01) |
| *H01L 23/532* | (2006.01) |
| *H01L 21/8238* | (2006.01) |
| *H01L 21/768* | (2006.01) |
| *H01L 23/535* | (2006.01) |

(52) U.S. Cl.
CPC .... *H01L 23/5283* (2013.01); *H01L 21/76816* (2013.01); *H01L 21/76895* (2013.01); *H01L 21/823821* (2013.01); *H01L 21/823871* (2013.01); *H01L 23/535* (2013.01); *H01L 23/53257* (2013.01); *H01L 27/0924* (2013.01); *H01L 27/1104* (2013.01)

(58) Field of Classification Search
CPC ......... H01L 21/76816; H01L 21/76895; H01L 27/0207; H01L 23/5283; H01L 27/0924; H01L 21/823821
See application file for complete search history.

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |

(Continued)

*Primary Examiner* — Nelson Garces
(74) *Attorney, Agent, or Firm* — Haynes and Boone, LLP

(57) ABSTRACT

An SRAM device and method of forming include pass gate (PG), pull-down (PD), and pull-up (PU) transistors. A first gate line of the PG and a second gate line of the PD and the PU extend in a first direction. A common source/drain of the PG, PD, and PU transistors interposes the first and second gate lines and another source/drain of the PG transistor. A first contact extends from the common source/drain and a second contact extends from the another source/drain. A third contact is disposed above the second contact with a first width in the first direction and a first length in a second direction, first length being greater than the first width.

20 Claims, 9 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,576,814 B2 | 2/2017 | Wu et al. |
| 2009/0014796 A1* | 1/2009 | Liaw .................. H01L 27/0886 365/156 |
| 2011/0317477 A1 | 12/2011 | Liaw |
| 2014/0032871 A1 | 1/2014 | Hsu et al. |
| 2014/0153321 A1 | 6/2014 | Liaw |
| 2014/0153322 A1* | 6/2014 | Liaw .................. H01L 27/0886 365/156 |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2015/0357279 A1* | 12/2015 | Fujiwara et al. ..... H01L 23/528 |
| 2018/0122812 A1* | 5/2018 | Liaw .................... H01L 23/528 |
| 2019/0006370 A1 | 1/2019 | Huang et al. |

* cited by examiner

SEMICONDUCTOR MEMORY DEVICE HAVING CONTACT ELEMENT OF RECTANGULAR SHAPE

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

A static random access memory (SRAM) cell has become a popular storage unit of high speed communication, high-density storage, image processing and system-on-chip (SOC) products. In some applications, SRAM devices design has focused on optimizing cell size and improving cell operation voltage, among other requirements. However, optimization SRAM performance and/or design requirements has been challenging. As merely one example, reducing the scaling of SRAM cells can lead to increase contact resistance affecting the device performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
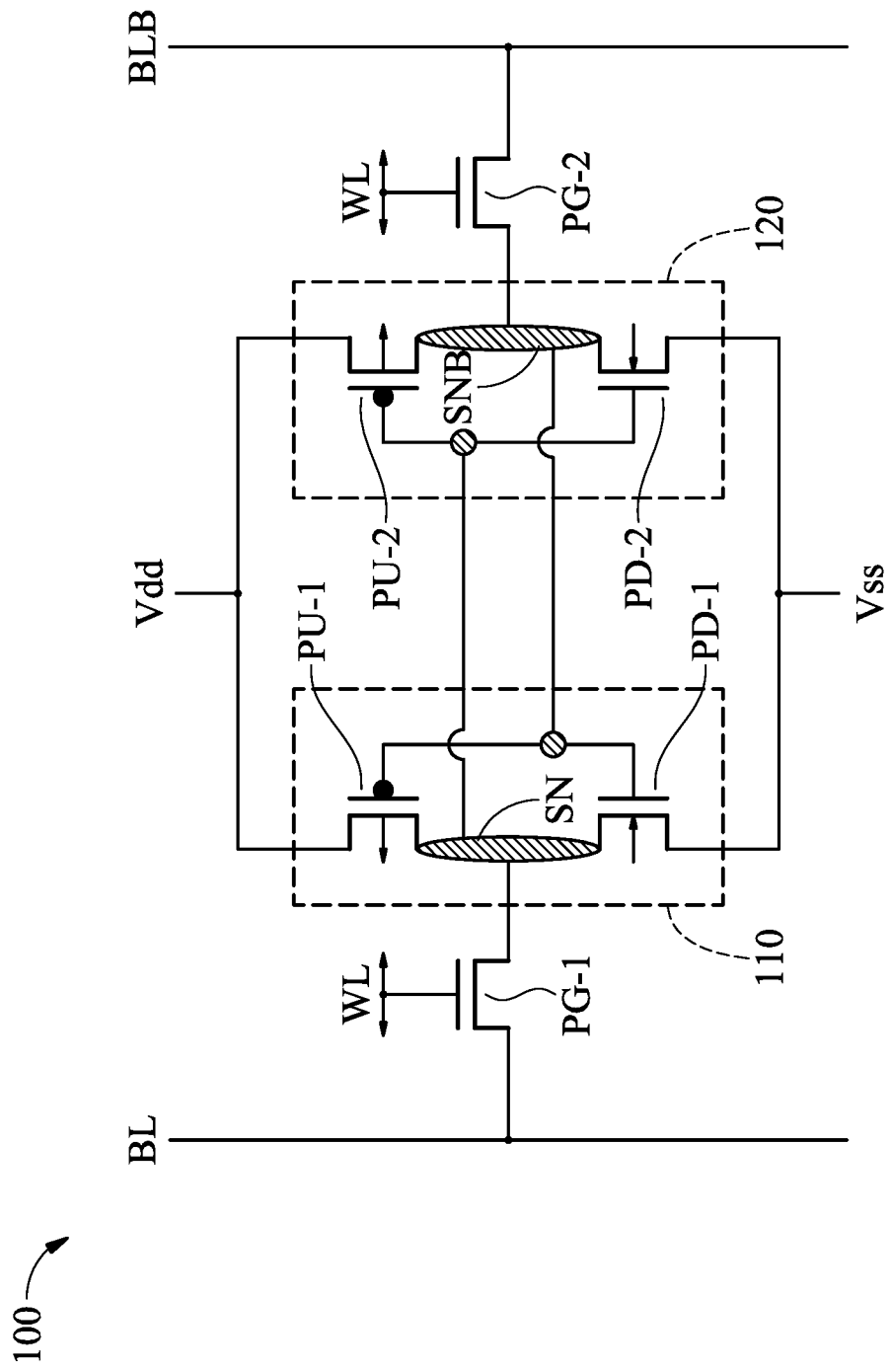
FIG. 1 provides an exemplary circuit diagram of an SRAM cell, which can be implemented in a memory cell of a SRAM array, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

It is also noted that the present disclosure presents embodiments that may include devices in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and methods of forming the same. In particular, embodiments of the present disclosure provide a process and/or structure for SRAM device. In some embodiments, the SRAM device according to certain aspects of the present disclosure provide for a reduced contact resistance.

For SRAM cells, reduction in technology node can lead to increased resistance between interconnection points.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for the layout of SRAM cells that include optimization of a contact element to reduce resistance. Generally, the various embodiments disclosed herein provide for modification of a contact to a source/drain contact. Additional embodiments and advantages are discussed below and/or will be evident to those skilled in the art in possession of this disclosure.

Typically, SRAM cells are interconnected in an array form and connected to logic devices formed on the same substrate used to control or otherwise interact with the array of memory cells. In various embodiments, the logic devices may include an inverter, an AND gate, a NAND gate, an OR gate, a NOR gate, a flip-flop, scan logic, or combinational logic. Such logic devices may, in some examples, be interconnected to form a circuit including a plurality of logic devices. The logic devices can include a plurality of CMOS devices such as planar or fin-type N-type FETs or P-type FETs.

Referring now to FIG. 1, illustrated therein is an exemplary circuit diagram of an SRAM cell 100, which can be implemented as a memory cell of a SRAM array, according to various aspects of the present disclosure. While FIG. 1 illustrates a single-port SRAM cell, it will be understood that the various disclosed embodiments may be equally implemented in a multi-port SRAM cell (e.g., such as a dual-port SRAM cell), without departing from the scope of the present disclosure. FIG. 1 has been simplified for the sake of clarity to better understand the inventive concepts of the present disclosure. Additional features can be added in the SRAM cell 100, and some of the features described below can be replaced, modified, or eliminated in other embodiments of SRAM cell 100.

The SRAM cell 100 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Thus, in some examples, the SRAM cell 100 may be referred to as a 6T SRAM cell. In operation, pass-gate transistor PG-1 and pass-gate transistor PG-2 provide access to a storage portion of the SRAM cell 100, which includes a cross-coupled pair of inverters, an inverter 110 and an inverter 120. Inverter 110 includes the pull-up transistor PU-1 and the pull-down transistor PD-1, and inverter 120 includes the pull-up transistor PU-2 and the pull-down transistor PD-2. In some implementations, pull-up transistors PU-1, PU-2 are configured as P-type FETs, and pull-down transistors PD-1, PD-2 are configured as N-type FETs. In some implementations, pass-gate transistors PG-1, PG-2 are also configured as N-type FETs. The FETs may be planar type FETs, fin-type FETs (or FinFETs), or other configures of transistors.

A gate of pull-up transistor PU-1 interposes a source (electrically coupled with a power supply voltage ($V_{DD}$)) and a first common drain CD1, and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Figure 2:
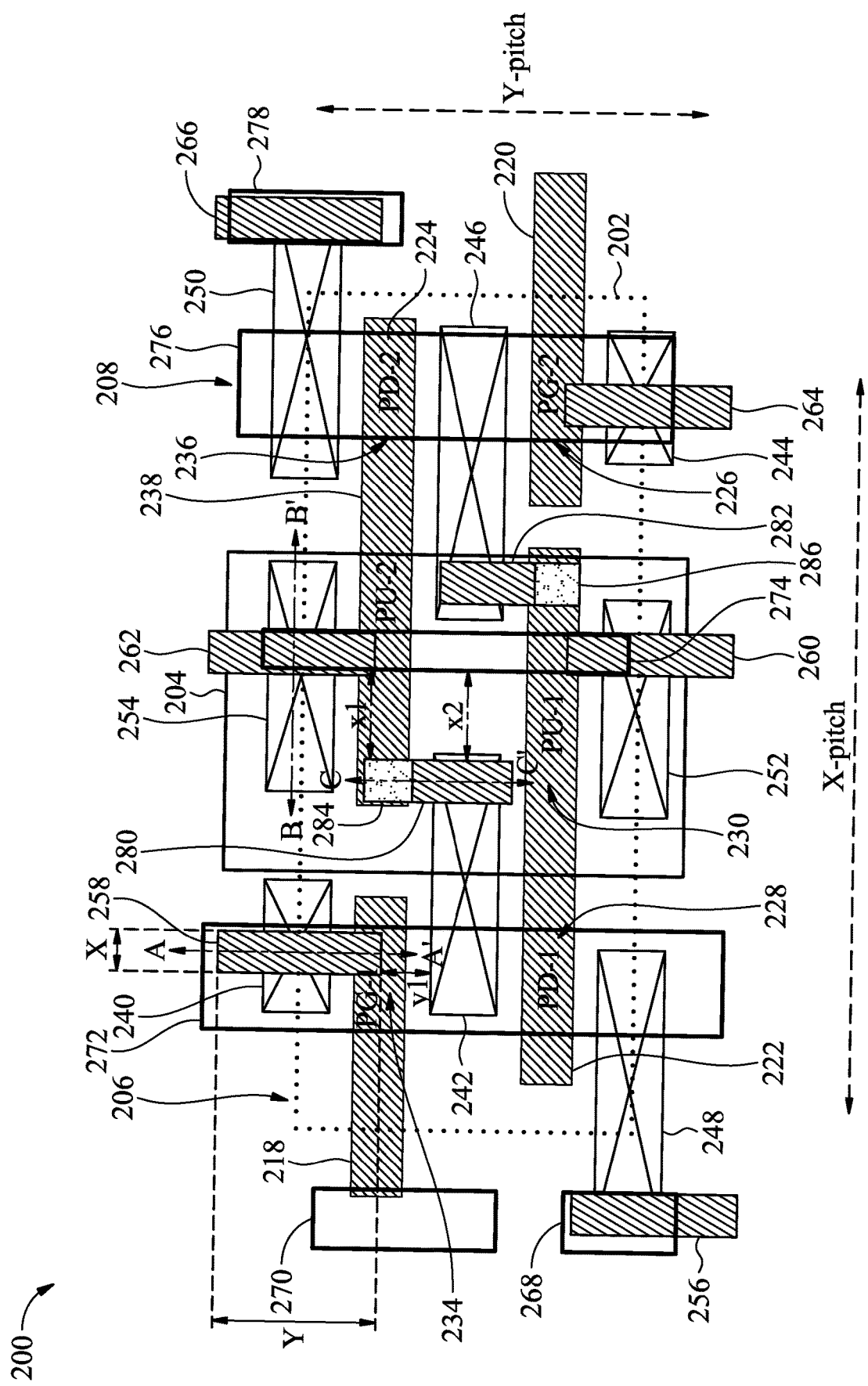
FIG. 2 provides an exemplary plan or layout view of an SRAM cell device, in accordance with some embodiments.
Figure 3A:
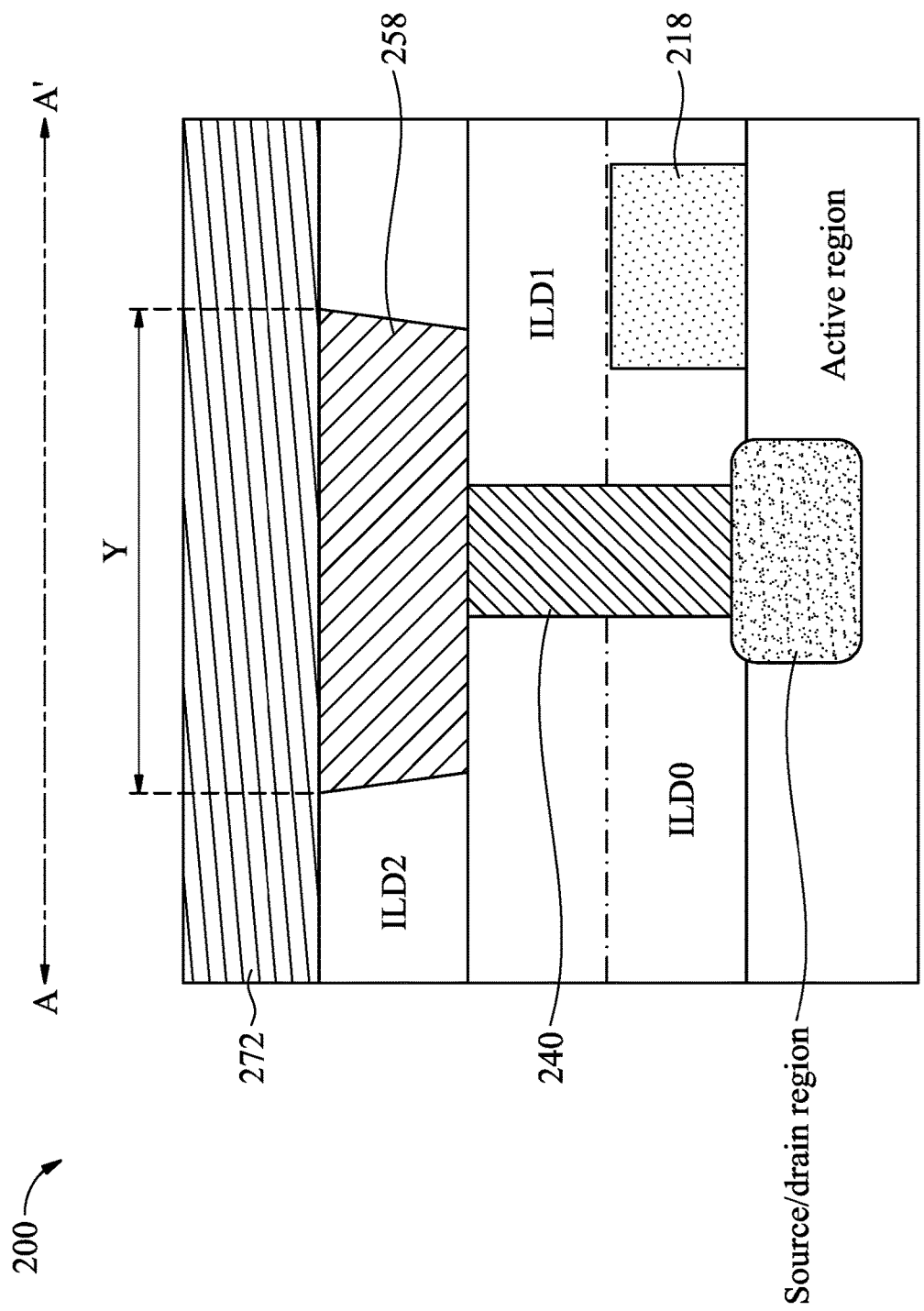
FIG. 3A provides a cross-sectional view of the SRAM cell of FIG. 2, along a plane substantially parallel to a plane defined by section AA' of FIG. 2, according to some embodiments.
Figure 3B:
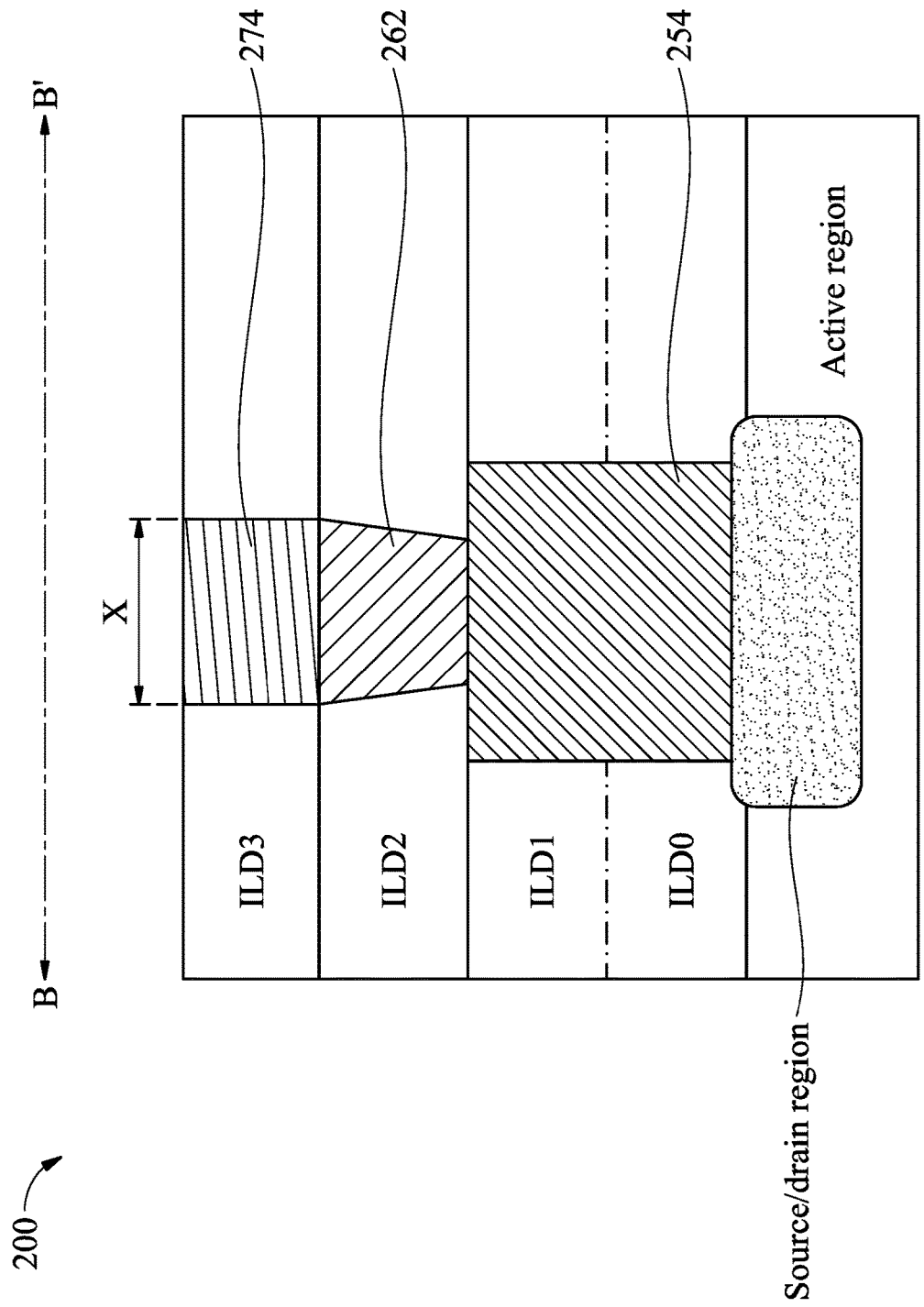
FIG. 3B provides a cross-sectional view of the SRAM cell of FIG. 2, along a plane substantially parallel to a plane defined by section BB' of FIG. 2, according to some embodiments.
Figure 3C:
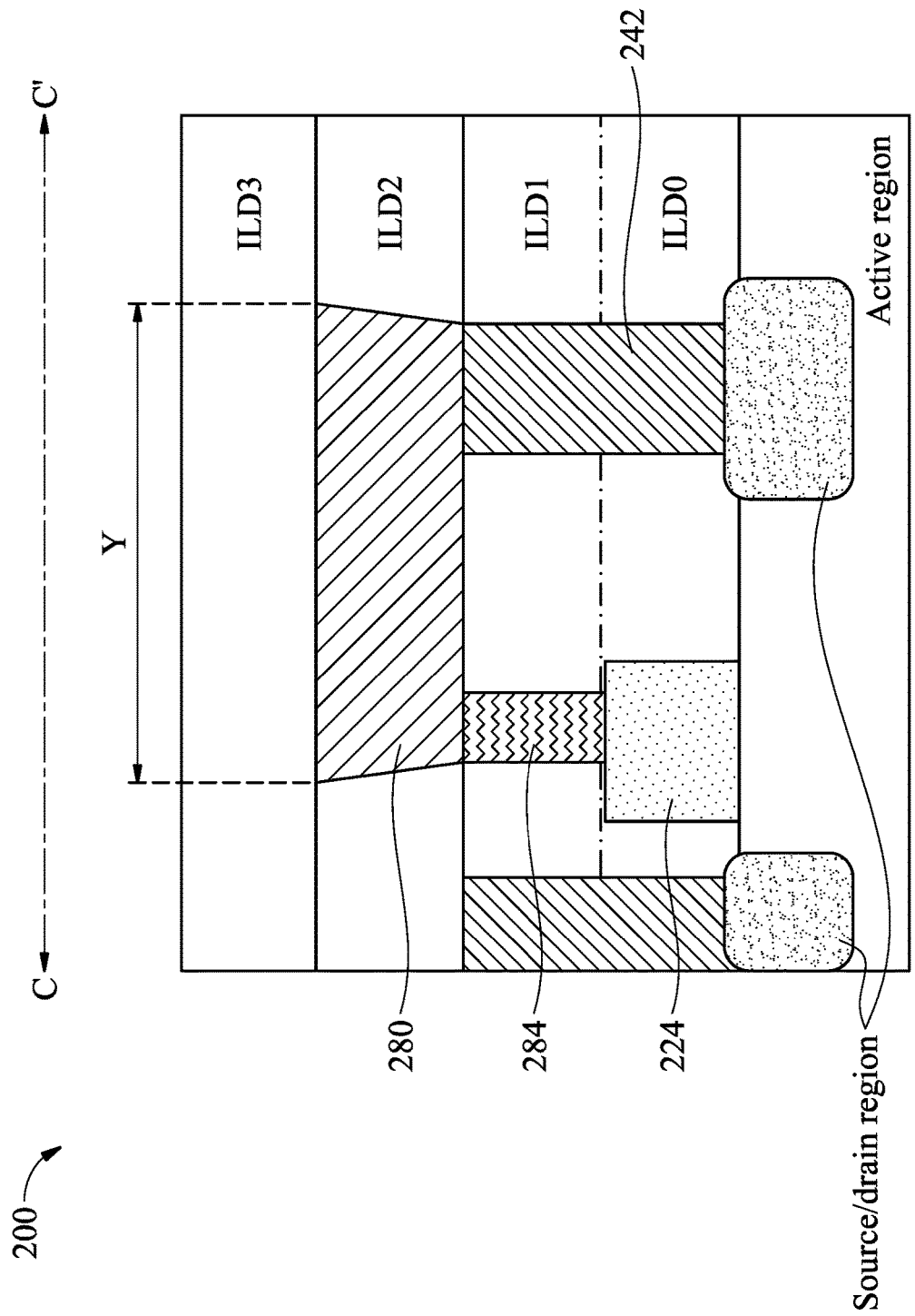
FIG. 3C provides a cross-sectional view of the SRAM cell of FIG. 2, along a plane substantially parallel to a plane defined by section CC' of FIG. 2, according to some embodiments.
Figure 4:
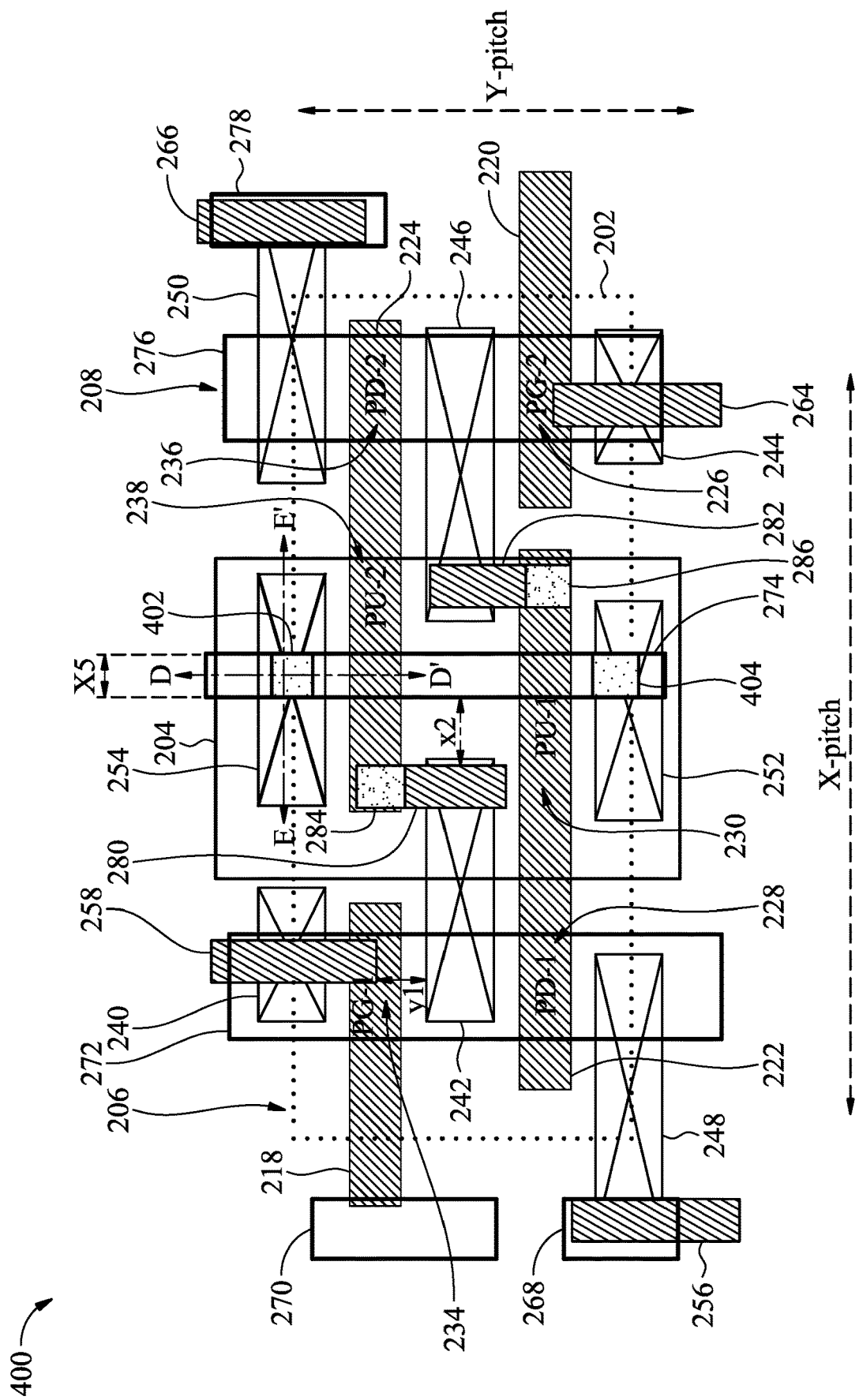
FIG. 4 provides an exemplary plan view of another SRAM cell device, in accordance with some embodiments.
Figure 5A:
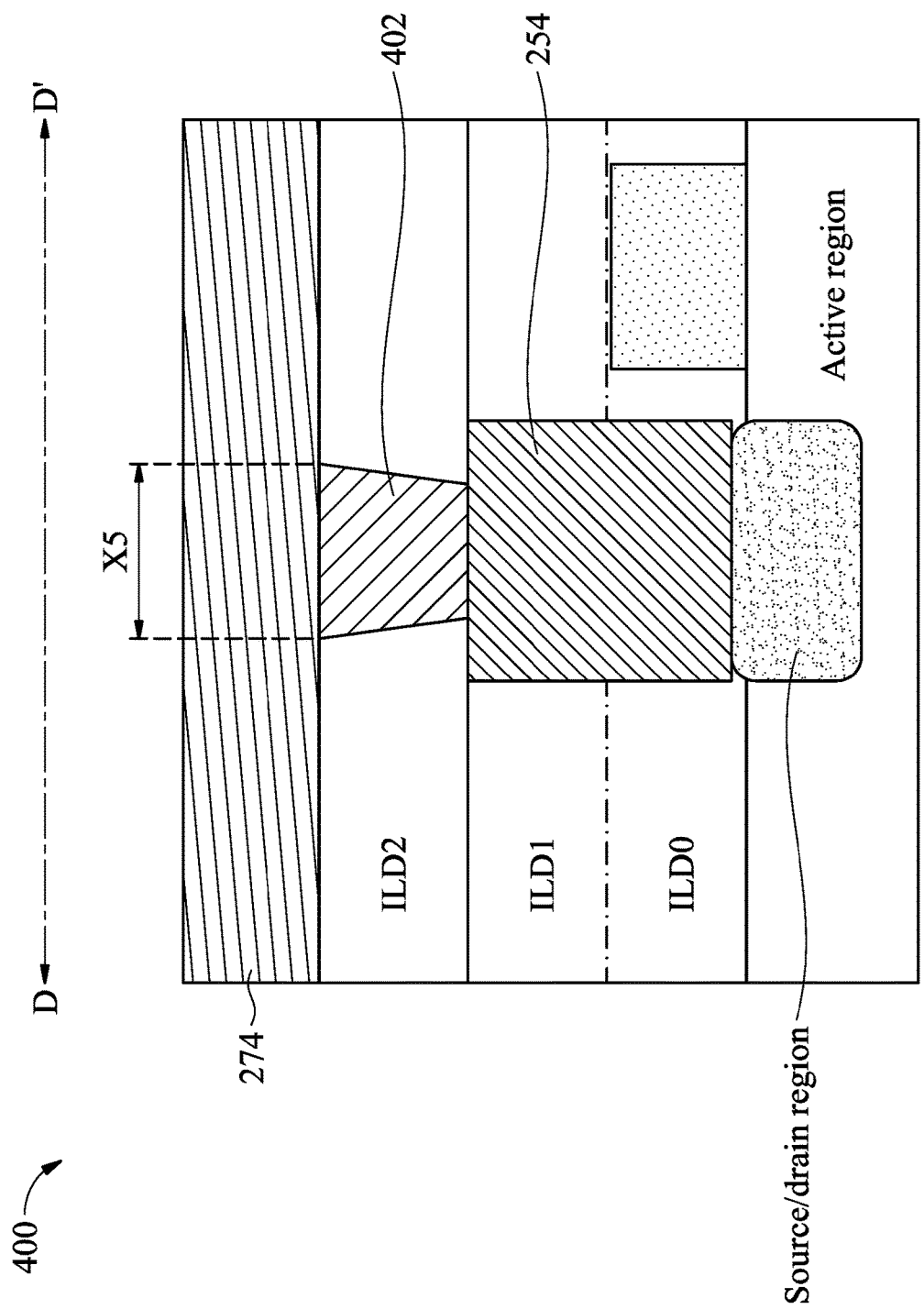
FIG. 5A provides a cross-sectional view of the SRAM cell of FIG. 4, along a plane substantially parallel to a plane defined by section DD' of FIG. 4, according to some embodiments.
Figure 5B:
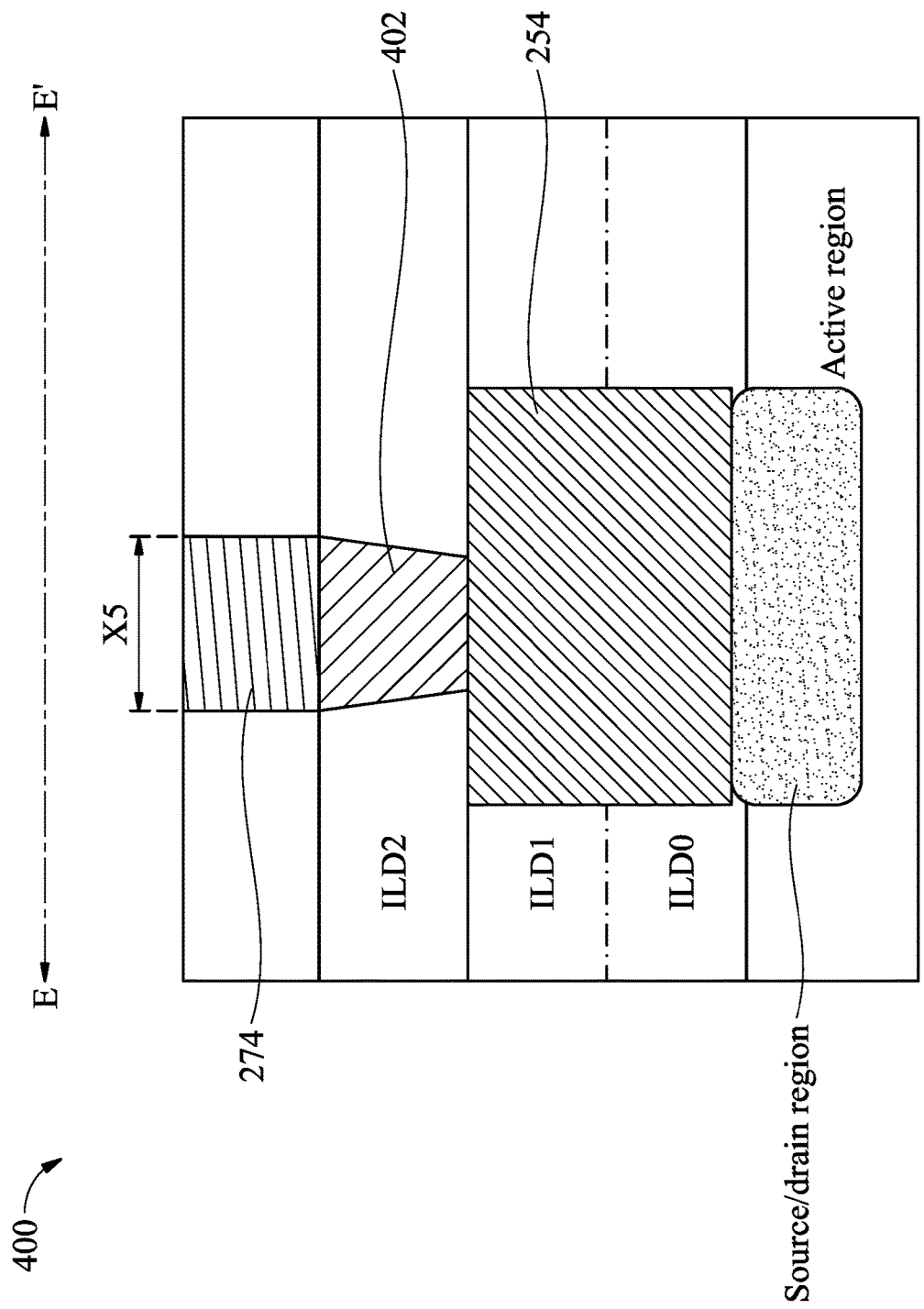
FIG. 5B provides a cross-sectional view of the SRAM cell of FIG. 4, along a plane substantially parallel to a plane defined by section EE' of FIG. 4, according to some embodiments.

In view of the above discussion with respect to FIG. 1, various embodiments of the present disclosure are now described. FIGS. 2 and 4 provide exemplary plan views of an SRAM cell, in accordance with some embodiments. In some embodiments, the SRAM devices may provide the circuit functionality substantially similar to as discussed above with reference to FIG. 1 and the memory cell 100. FIGS. 3A, 3B, and 3C provide cross-sectional views of the SRAM device of FIG. 2, along a plane substantially parallel to a plane defined by section AA', BB', or CC' respectively of FIG. 2. Similarly, FIGS. 5A and 5B provide cross-sectional views of the SRAM cell of FIG. 4, along a plane substantially parallel to a plane defined by section DD' or EE' of FIG. 4 respectively. It is understood that the various figures, and any accompanying descriptions given, are merely exemplary and are not intended to be limiting beyond what is specifically recited in the claims that follow. In addition, the various figures shown and described have been simplified for the sake of clarity to better understand the inventive concepts of the present disclosure, and various features may be added, replaced, modified, or eliminated, without departing from the scope of the present disclosure.

With reference now to FIGS. 2, 3A, 3B, and 3C, and in some embodiments, a semiconductor device (e.g., on a given substrate) may include a plurality of SRAM devices including the SRAM device 200 (e.g., within a memory portion of the semiconductor device). The SRAM device 200 may also be referred to as a memory cell or SRAM cell. In an embodiment, the SRAM device 200 is a plan view of a layout of the SRAM cell 100.

In particular, the SRAM device 200 shows an SRAM unit cell 202 having an X-pitch 'X' (e.g., following a gate routing direction) and a Y-pitch 'Y' substantially perpendicular to the 'X' direction (e.g., following an active region routing direction, which in some embodiments, is a fin region). In some embodiments, the SRAM device 200 may include a plurality of SRAM unit cells 202 arranged, for example, in a plurality of columns and rows (e.g., to provide a memory array). In some cases, the SRAM unit cell 202 may include a first dopant type region 204 (e.g., N-wells) disposed between two other dopant type regions 206, 208 (e.g., P-wells). In some embodiments, the region 206 includes a first pass gate (PG-1) transistor and a first pull-down (PD-1) transistor, and the region 208 includes a second pass gate (PG-2) transistor and a second pull-down (PD-2) transistor. The region 204 may include a first pull-up (PU-1) and a second pull-up (PU-2) transistor. In some examples, one or more of these transistors is a FinFET transistor, the active region being disposed on a fin extending above the semiconductor substrate.

Each of the PG-1, PG-2, PD-1, PD-2, PU-1, and PU-2 transistors of the SRAM device 200 include a gate structure. For instance, PG-1 includes a gate line 218 that spans perpendicularly across a channel region 234 of an active region adjacent the gate, PG-2 includes a gate line 220 that spans perpendicularly across a channel region 226 of an active region adjacent the gate, PD-1 and PU-1 include a gate line 222 that spans perpendicularly across a channel region 228 and across a channel region 230 of the active region adjacent the gate, and PD-2 and PU-2 include a gate line 224 that spans perpendicularly across a channel region 236 of an active region adjacent the gate and across a channel region 238 of an active region adjacent the gate. In some embodiments, one or more or all of the active regions are fin elements extending above a semiconductor substrate. In some embodiments, the active regions are doped portions of the semiconductor substrate. In some embodiments, the active regions are substantially rectangular shapes, where long axes are substantially parallel to a first direction (y-direction). However, other shapes of the active regions are also possible.

Thus, the gate lines 218, 220, 222, 224 form gate structures that include a dielectric layer (e.g., including an interfacial layer and a high-K dielectric layer) formed over respective channel regions of the active regions (e.g., fins) over which the various gates are disposed, and one or more metal layer(s) formed over the dielectric layer. As one example, and as exemplified by in FIGS. 3A, 3B, and 3C, the gate line 222 forming the gate structures of PD-1 and PU-1 may include a dielectric layer formed over the channel region 228 of the active region and over a channel region 230 of the active region, and a metal layer formed over the dielectric layer; the metal layers of the PD-1 and PU-1 gate structures may be different providing different work functions. The SRAM device 200 may also include various isolation regions between the active regions. In some embodiments, the substrate material of the disclosed devices may be selected from a group including bulk-Si, SiP, SiGe, SiC, SiPC, Ge, SOI-Si, SOI-SiGe, III-VI materials, a combination thereof, or other materials as described above.

In various embodiments, each of the PG-1, PG-2, PD-1, PD-2, PU-1, and PU-2 transistors of the SRAM device 200 includes source/drain regions on portions of their respective active regions (e.g., fins) adjacent to and on either side of their respective gates, and thus adjacent to and on either side of their respective channel regions (e.g., such as the channel regions 226, 228, 230, 234, 236, and 238). The source/drain features may be implanted regions in the semiconductor substrate, epitaxially grown features, and/or other suitable features forming source/drain of a transistor. In some embodiments, the material of an N-type doped source/drain region includes an epi profile, and the epi material may be selected from a group including SiP, SiC, SiPC, SiAs, Si, or a combination thereof. In some cases, the material of a P-type doped source/drain region includes an epi profile, and the epi material may be selected from a group including SiGe, SiGeC, Ge, or a combination thereof. In some examples, a plurality of contacts may be directly (physically) interfacing to the source/drain regions of the SRAM device 200. These contacts may be referred to as "MD" or metal-diffusion contacts. In some embodiments, the MD contacts include a silicide portion of the source/drain region and an overlying vertically extending conductive layer.

Referring to the example of FIG. 2, the PG-1 transistor may include a source contact 240 (e.g., to bit-line node 'BL') and a drain contact 242 (e.g., to first common drain) connected to respective source/drain regions of the PG-1 transistor, the PG-2 transistor may include a source contact 244 (e.g., to bit-line-bar node 'BLB') and a drain contact 246 (e.g., to second common drain) connected to respective source/drain regions of the PG-2 transistor, the PD-1 transistor may include a source contact 248 (e.g., to CVss node) and the drain contact 242 (e.g., to first common drain) connected to respective source/drain regions of the PD-1 transistor, the PD-2 transistor may include a source contact 250 (e.g., to CVss node) and the drain contact 246 (e.g., to second common drain) connected to respective source/drain regions of the PD-2 transistor, the PU-1 transistor may include a source contact 252 (e.g., to CVdd node) and the drain contact 242 (e.g., to first common drain) connected to respective source/drain regions of the PU-1 transistor, and the PU-2 transistor may include a source contact 254 (e.g., to CVdd node) and the drain contact 246 (e.g., to second common drain) connected to respective source/drain regions of the PU-2 transistor.

The contact patterns 240-254 (e.g., MD) are formed as substantially rectangular shapes over corresponding active areas, where long axis of each of the contact patterns 240-254 is substantially parallel to a second direction (X-direction). In some embodiments, contact patterns 240-254 have shapes other than substantially rectangular. The contact patterns 240-254 are fabricated as conductive elements and provide electrically connection between features including as discussed above. To that effect, each of contact patterns 240-254 may be coplanar with one another, the contact patterns 240-254 interfacing the active region (e.g., source/drain) as discussed above on a bottom surface. Each of the contact patterns 240-254 interface a respective one of contact elements 256, 258, 260, 264, 266 (discussed below) on a top surface of the respective contact patterns 240-254.

In some embodiments, the contact patterns (240, 248, 250, 254, 246, 242, 248, 252, 244) (e.g., those directly interfacing and contacting the source/drain regions) may be formed as including multiple metal materials that may be selected from a group including Ti, TiN, TaN, Co, W, Al, Ru, Cu, silicides, or a combinations thereof. In an embodiment, the contact patterns 240-254 are formed a silicide layer and an overlying tungsten layer.

The gate structures formed to provide gate lines 218, 220, 222, and/or 224 may be a high-K/metal gate stack, however other compositions are possible. In various embodiments, the gate dielectric includes an interfacial layer (IL) and a high-K gate dielectric layer formed over the interfacial layer. High-K gate dielectrics, as used and described herein, include dielectric materials having a high dielectric constant, for example, greater than that of thermal silicon oxide (~3.9). In some embodiments, the interfacial layer may include a dielectric material such as silicon oxide (SiO2), HfSiO, or silicon oxynitride (SiON). The high-K gate dielectric layer may include a high-K dielectric layer such as hafnium oxide (HfO2). Alternatively, the high-K gate dielectric layer may include other high-K dielectrics, such as TiO2, HfZrO, Ta2O3, HfSiO4, ZrO2, ZrSiO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), combinations thereof, or other suitable material.

In addition, the structure of the gate (e.g., such as the gate lines 218, 220, 222, 224) may include multiple materials forming a gate electrode. In some embodiments, the gate electrode may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, a metal layer of the gate electrode may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Further, the gate electrode may be formed separately for N-FET and P-FET transistors which may use different composition metal layers. In at least some embodiments, the gate electrode layer is polysilicon.

The SRAM device 200 also includes a plurality of contacts 256, 258, 260, 262, 264, and 266. The contacts 256, 258, 260, 262, 264, and 266 may also be referred to as VDR (or VD rail) contacts. In an embodiment, a VDR contact may include a contact structure that has a length and a width, where the length is approximately 2 to 3 times greater than the width. In an embodiment, the VDR contact has a length 2.5 times or greater the width. The contacts 256-266 are formed as substantially rectangular shapes over the contact patterns 240-254 (MD contacts). The contacts 256-266 have long axis that are substantially parallel to the first direction (y-axis). The contacts 256, 258, 260, 262, 264, and 266 are formed above the contact patterns 240-254. In some embodiments, the contacts 256, 258, 260, 262, 264, and 266 do not extend to interface the source/drain regions, gate regions, or substrate. Rather, the contacts 256, 258, 260, 262, 264, and 266 interface the MD contacts, which extends from the source/drain, or a VG contact, which extends from a gate. The contacts 256-266 represent portions of conductive layers that connect respective portions of the MD contact patterns 240-254 and metallization lines.

The substantially rectangular shapes of the contacts 256, 258, 260, 262, 264, and 266 are characterized by having a longer axis (length) in one direction as opposed to the other direction. To be clear, the rectangular shapes illustrated by the plan views of FIGS. 2 and 4 are for ease of understanding. In defining these features for example on a photomask, or fabricating the features onto a substrate in a functional semiconductor device, the term substantially rectangular includes those features that may be rounded (such as an oval shape that may result from lithography processes in fabricating the device) or be a substantially rectangular shape having lithography assistant features applied thereto (e.g., optical proximity correction (OPC) features, corner rounding, etc.).

The VDR contacts 256-266 may be formed on a substrate as including one or more conductive materials such as Ti, TiN, TaN, Co, W, Al, Ru, Cu, silicides, or combinations thereof. In an embodiment, VDR contacts 256-266 include tungsten.

One or more of the VDR contacts 256-266 has a length Y extending in the first direction and a width X extending in the second direction. The length Y may be referred to as the long axis, as it defines the length of a longer side of a substantially rectangular shape, while X may be referred to as the short axis. This is annotated on FIG. 2 with respect to VDR contact 262, however, these dimensions may be equally applicable to any or all other VDR contacts 256-266. In an embodiment, Y is between approximately 2*X and approximately 3*X. In an embodiment, Y is at least 2.5 times greater than X. Exemplary dimensions include X between approximately 10 nm and approximately 20 nm. In a further embodiment, Y is between approximately 30 nm and 50 nm. These dimensions may be selected and/or determined based on the technology node for which device 200 is to be formed, fabrication process control, and spacing considerations with respect to other elements. For example, in an embodiment, a dimension x1, a dimension x2 and/or a dimension y1 may be determined for a layout. In some embodiments, x1, x2, and y1 are design rules to be implemented for the layout of SRAM 200. In an embodiment, dimension x1 is a minimum space between adjacent VDR elements (e.g., 280 and 262). In an embodiment, dimension x2 is a minimum space between VDR elements and metallization layer (e.g., M0) (e.g., 280 and 274). In an embodiment, y1 may be a minimum spacing between VDR contact and a source/drain contact (MD) between which an interconnection is not desired (e.g., 258 and 242). Exemplary dimensions for x1 include between approximately 10 nm and approximately 20 nm. Exemplary dimensions for x2 include between approximately 10 nm and approximately 20 nm. Exemplary dimensions for y1 are between approximately 20 nm and approximately nm. However, these dimensions are exemplary only and not intended to be limiting beyond what is specifically claimed below.

As illustrated in FIG. 3A, a termination edge of VDR contact element 258 is above a gate line 218. The termination edge of a feature such as a conductive contact or line refers to the end of the conductive feature that interfaces an adjacent feature (e.g., dielectric layer). The termination edge may vertically overlie a feature without contacting thereto.

The SRAM device 200 also includes contacts 280 and 282. Contacts 280 and 282 may also be referred to as additional VDR contact patterns. In an embodiment, contacts 280 and 282 are coplanar with contacts 240-254. However, different than the VDR contact patterns 256-266, contacts 280 and 282 serve to interconnect an MD contact and a VG contact (which extends to a gate structure). The contacts 280 and 282 are formed as substantially rectangular shapes and include a long axis that is substantially parallel to the first direction (y-axis). Contact 280 represents a conductive element which connects portions of corresponding contact 242 with gate 224. Contact 282 represents a conductive element which connects portions of corresponding contact 246 with gate 222. The contacts 280 and 282 may be fabricated of conductive materials including copper, tungsten, and/or silicide. In an embodiment, the contacts 280 and 282 are tungsten.

Via patterns 284 and 286 are formed as substantially square shapes over corresponding gate lines 224 and 222 respectively. The via patterns 284 and 286 represent conductive features. The via patterns 284 and 286 may be formed as conductive features that interface a gate structure. The via patterns 284 and 286 may electrically connect the respective gate lines 224 and 222 with a respective one of the additional VDR contact 280 and 282, which in terms connects to a MD contact. The via patterns 284 and 286 may be formed as including conductive materials such as copper, tungsten, and/or silicide. In an embodiment, the via patterns 284 and 286 are formed including tungsten. In an embodiment, the via patterns 284 and/or 286 may have a dimension of approximately X (discussed above).

The SRAM device 200 also includes a plurality of metallization lines 268, 270, 272, 274, 276, and 278. These metallization lines may be coplanar with one another and formed over the contacts discussed above. In an embodiment, the metallization lines 268, 270, 272, 274, 276, and 278 are a first level of metallization of a multi-layer interconnection (MLI) that includes a plurality of layers of metallization lines interconnected with vertically extending vias interconnecting the plurality of layers. The metallization lines 268, 270, 272, 274, 276, and 278 may include copper, aluminum, or other suitable conductive materials. In an embodiment, the metallization lines 268, 270, 272, 274, 276, and 278 may include a plurality of layers including barrier layers, liner layers, adhesion layers, and/or other suitable layers. Exemplary materials that may be included in the metallization lines 268, 270, 272, 274, 276, and 278 are titanium, titanium nitride, tantalum, tantalum nitride, combinations thereof, and/or suitable materials.

In furtherance of the example, a multilayer interconnection may include vertical interconnects, such as vias or contacts (284, 286, 280, 282, etc.), and horizontal interconnects, such as metal lines (e.g., 268, 270, 272, 274, 276, and 278). The various interconnection features may employ various conductive materials including copper, tungsten, and/or silicide. In one example, a damascene and/or dual damascene process is used to form a copper related multilayer interconnection structure.

FIGS. 3A, 3B, and 3C illustrate a cross-sectional view of the layout 200 formed on a semiconductor substrate. The features of FIG. 2 are typically surrounded by dielectric material such as an interlayer dielectric or ILD material. It is noted that FIGS. 3A, 3B, and 3C illustrate a plurality of layers of ILD material, each formed sequentially. In some embodiments, one or more of the ILD0, ILD1, ILD2, and ILD3 layers include a same composition. In some embodiments, one or more of the ILD0, ILD1, ILD2, and ILD3 layers include a different composition than one another. It is noted that for simplicity additional layers such as etch stop layers that may be present in addition to the ILD layers (e.g., interposing ILD layers) are not shown.

With reference now to FIGS. 4, 5A, and 5B, an SRAM layout 400 is illustrated in FIG. 4, and cross-sectional views of the layout 400 as fabricated on a semiconductor substrate are shown in FIGS. 5A and 5B. A semiconductor device (e.g., on a given substrate) may include a plurality of SRAM devices including the SRAM device 400 (e.g., within a memory portion of the semiconductor device). The SRAM device 400 may also be referred to as a memory cell or SRAM cell. In an embodiment, the SRAM device 400 effectuates the circuit of SRAM 100 and is substantially similar to that of the SRAM cell 200, with differences noted herein. To that effect, the cross-sectional views of FIGS. 3A, 3B, and 3C may also apply to the SRAM device 400.

One difference between the SRAM device 400 and that of SRAM device 200 is the provision of vias 402 and 404 in lieu of contact elements 260 and 262 (see FIG. 2) of substantially rectangular shape. The vias 402 and 404 may be substantially square in shape having a substantially equal length on each side. In an embodiment, the length is denoted X5. In an embodiment, X5 is substantially equal to dimension X discussed above with reference to the SRAM device 200. In an embodiment, the SRAM device 200, including vias 402 and 404, continues to maintain the rectangularly shaped VDR contacts 256, 258, 266 and 264 as discussed above. The vias 402 and/or 404 may be fabricated to comprise tungsten, or other suitable conductive material. The vias 402 and/or 404 provide a vertical routing connecting the above metallization (MO) 274 and the underlying, respective MD contact 254 or 252.

A determination between the implementation of the SRAM device 400 and that of SRAM device 200 may be dependent on the design performance (e.g., resistance) desired for the integrated circuit, the process tolerances, and/or other factors. For example, a comparison of the SRAM device 400 and the SRAM device 200 illustrates that the constraint x1, illustrated above in FIG. 2, can be alleviated by use of the SRAM device 400. In some embodiments, the alleviation of the constrain x1 has a trade-off in increased contact resistance.

Figure 6:
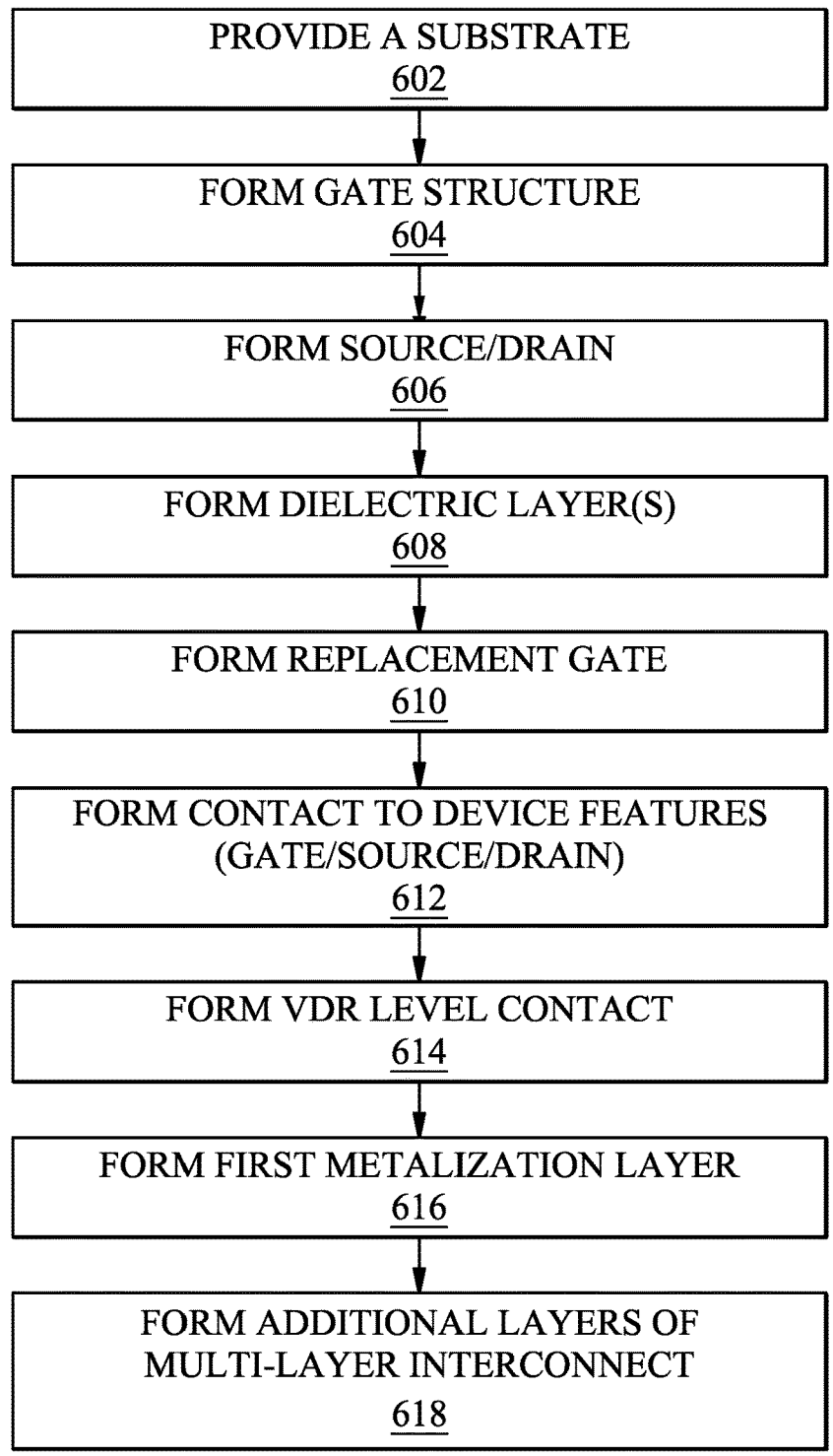
FIG. 6 is an exemplary method of fabricating a semiconductor device including an SRAM cell, in accordance with one or more embodiments.

Referring now to FIG. 6, illustrated is an exemplary general method 600 of fabricating a semiconductor device (e.g., including implementing on a semiconductor substrate one or more of the devices 100, 200, or 400 in accordance with one or more embodiments). It is understood that parts of the method 600 and/or the semiconductor device fabricated thereby may be fabricated by a well-known CMOS technology process flow, and thus some processes are only briefly described herein.

The method 600 begins at block 602 where a substrate (e.g., such as a silicon substrate) is provided. In some examples, the substrate may include a variety of materials and/or configurations. The provision of the substrate may include providing a substrate having fin structures and suitable well and channel doping may be performed. In some embodiments, the substrate material of the disclosed devices may be selected from a group including bulk-Si, SiP, SiGe, SiC, SiPC, Ge, SOI-Si, SOI-SiGe, III-VI materials, a combination thereof, or other materials as described above. Thereafter, the method 600 proceeds to block 604 where a plurality of gate structures are formed. By way of example, the gate structure may include one or more of the gate lines discussed above (e.g., including a gate dielectric layer and a metal layer over the gate dielectric layer). Alternatively, the gate structures may first be formed as dummy gate structures, which are subsequently replaced by a gate dielectric and metal layer after formation of one or more features (e.g., source/drain) aligned to the dummy gate structure.

The method 600 then proceeds to block 606 where device source/drain regions are formed, such as the source/drain regions discussed above. In some embodiments, the source/drain features are formed by epitaxially growing a semiconductor material layer or layers on the exposed semiconductor material of the substrate, for example, in or over a fin element extending above the substrate. The source/drain regions may be suitably doped.

The method 600 then proceeds to block 608 where one or more dielectric layers are formed over the gate structure and source/drain features. The one or more dielectric layers may be formed such as a contact etch stop layer (CESL) and/or an inter-layer dielectric (ILD) layer. In some embodiments, a contact etch stop layer (CESL) is formed over the substrate prior to forming the ILD layer. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique.

In some embodiments, the method 600 then proceeds to block 610 where the gate structure of block 602 is removed and a replacement gate (e.g., gate dielectric and metal gate electrode) is formed in the region provided by the removal of the replacement gate. The gate formed in block 610 may be a gate for a multi-gate device (e.g., a Gate-All-Around (GAA) device, a planar transistor, a FinFET, or other suitable device). In other embodiments, block 610 is omitted.

The method 600 then proceeds to block 612 where a first level of contacts is formed to one or more features of the device. In an embodiment, additional dielectric material is deposited such as an additional ILD layer (e.g., ILD1) that overlies the ILD layer of block 608 (e.g., ILD0). The ILD1 layer may include SiO$_2$, tetraethyl orthosilicate (TEOS), high density plasma (HDP), undoped silicate glass (USG), various low-k dielectric compositions. The additional ILD layer (ILD1) may be formed by employing a spin on method, a chemical vapor deposition (CVD) method, or other suitable method. As discussed above with reference to ILD0, additional dielectric layers may also be formed including, for example, an etch stop layer (ESL) formed over the top surface of the ILD1. In an embodiment, ILD1 is an oxide-based material and the ESL is nitride material. The first level of contacts formed in block 612 may extend through ILD0 and/or ILD1 to reach a transistor feature such as source/drain or gate.

Thus, as an example of block 610, in an embodiment, a first level of contact features is formed to contact the gate structures. In doing so, openings in the ILD layer(s) may be formed providing a vertically extending opening or trench to expose a top surface of the gate structures. In an embodiment, gate contacts such as 284, 286 may be formed. These gate contacts may include, for example, tungsten.

In some embodiments, block 612 includes forming to interconnect to one or more source/drain features of the device. In doing so, openings in the ILD layer of block 608 and/or additional ILD layers may be formed providing a vertically extending opening/trench to expose a top surface of the source/drain structures. The openings/trenches in the ILD layer(s) may then be filled with conductive material. In an embodiment, a portion of the source/drain region exposed by the trench is silicided. In an embodiment, source/drain contacts such as 218, 222, 224, 220 may be formed. The source/drain contacts may include tungsten and/or silicide. The contacts to the gate structure and the contacts to the source/drain structure may be formed concurrently, may be patterned separately providing two sets of openings in the ILD layer of block 608, which are then filled with conductive material, or may be separately formed. It is noted that the contacts formed of this first level may include coplanar top surfaces.

The method 600 then proceeds to block 614 where a second level of contact (above that of block 612) is formed. In some embodiments, this is referred to as a VDR-level contact. In some embodiments, an additional ILD layer (e.g., ILD2) is formed over the previously deposited ILD layers (e.g., ILD0, ILD1). The additional ILD layer (e.g., ILD2) may include a same or different composition than the underlying dielectric layers (e.g., ILD1). For example, the ILD2 layer may include SiO$_2$, tetraethyl orthosilicate (TEOS), high density plasma (HDP), undoped silicate glass (USG), various low-k dielectric compositions. The additional ILD2 layer may be formed by employing a spin on method, a chemical vapor deposition (CVD) method, or other suitable method. As discussed above, additional dielectric layers may also be formed including, for example, an etch stop layer (ESL) formed over the top surface of the ILD2. In an embodiment, ILD2 is an oxide-based material and the ESL formed thereover is nitride material. Openings in the additional ILD layer, ILD2, are formed and filled with conductive material to form the level of contacts provided by block 614. The openings may be formed as substantially rectangular openings, or shapes otherwise having a long axis and a short axis as illustrated in FIGS. 2 and 4. Exemplary conductive materials include, but are not limited to, tungsten. In some embodiments, the VDR contacts such as 256, 258, 260, 262, 264, 368 may be formed as discussed in block 614. That is, the VDR contacts may be formed above the first level of contacts—source/drain contacts and the gate contacts. For example, the VDR-level contacts may contact a top surface of the source/drain contacts or gate contacts respectively and extend above this interface.

The method 600 then proceeds to block 616 where a first metallization layer is formed. The first metallization layer may include an interconnect layer that provides horizontal routing of the signals received, for example, to and from the contacts discussed in blocks 612 and 614 above. In an embodiment, the first metallization layer may be referred to as metal-0 (M0). The metallization layer may be formed by depositing additional ILD layer(s) (e.g., ILD3), forming a pattern of openings or trenches in the ILD layer(s) (e.g., ILD3), and depositing conductive materials in said openings to form the first metallization layer. In an embodiment, the metallization layer including 268, 270, 272, 274, 276, 278 is formed. The metallization layer may include copper. In some embodiments, various layers such as adhesion, glue or liner layers are also provided in the metallization layer.

The method 600 then proceeds to block 618 where additional layers of a multi-layer interconnect are formed including vias connecting the first metallization layer with an above metallization layer (e.g., metal-1 or M1). Any number of metallization layers may be used, for example, more than 5 metallization layers is typical.

Thus, the various embodiments described herein offer several advantages over the existing art. It will be understood that not all advantages have been necessarily discussed herein, no particular advantage is required for all embodiments, and other embodiments may offer different advantages. For example, in some embodiments, the resistance of the device may be decreased due to the layout such as illustrated in FIGS. 2 and 4. In an embodiment, the interface between the VDR contacts (having a rectangular shape) and the above metallization layer serves to provide a reduction in resistance at the interconnection. Additional embodiments and advantages will be evident to those skilled in the art in possession of this disclosure.

Thus, in one of the broader embodiments discussed herein, provided is a semiconductor device that includes an SRAM device including a pass gate (PG) transistor, a pull-down (PD) transistor, and a pull-up (PU) transistor. The device further includes a first gate line of the PG transistor, a second gate line of the PD transistor and the PU transistor. The first gate line and the second gate line extend in a first direction. The device also includes a common source/drain region of the PG, PD, and PU transistor interposing the first gate line and the second gate line and another source/drain region of the PG transistor. A first contact extends from the common source/drain region and a second contact extends from the another source/drain region. A third contact is disposed above the second contact. The third contact have a shape with a first width in the first direction and a first length in a second direction. The second direction is perpendicular to the first direction and the first length being greater than the first width.

In a further embodiment, the third contact directly interfaces the second contact and an overlying metallization layer. In an embodiment, the first length is approximately 2 to 3 times the first width. In a further embodiment, the first contact has a second length greater than a second width of the first contact, and the second contact has a third length greater than a third width of the second contact. Each of the second and third lengths may extend in the first direction.

In an embodiment, a fourth contact disposed above the first contact, the fourth contact having a substantially rectangular shape in a plan view. Further, in an embodiment, a via extends from the fourth contact to a third gate line of the SRAM device. The third gate line may be associated with another PU transistor and another PD transistor of the SRAM device.

In an embodiment, the device of the broader embodiment includes a third source/drain region of the PD transistor, the second gate line interposing the common source/drain region and the third source/drain region. A fourth contact may be extending from the third source/drain region, wherein the fourth contact is substantially rectangular in shape having a long axis in the first direction. A fifth contact is formed above the fourth contact to a first metallization line. The fifth contact is substantially rectangular in shape having a long axis in the second direction. A termination edge of the third contact is a first distance from a plane extending from a nearest edge of the first contact. The termination edge may be above the first gate line.

In an embodiment, the first contact, the second contact and the third contact each include tungsten. In an embodiment, a top surface of the first contact and a top surface of the second contact are coplanar.

In another of the broader embodiments of the present disclosure, a semiconductor memory device includes a pass gate transistor including a first gate and a first source/drain region, a first contact element extending from the first source/drain region, and a second contact element extending above the first contact element, and a metallization layer over the second contact element. The first contact element may be substantially rectangular in shape having a first length in a first direction and a first width in a second direction, the second direction substantially perpendicular to the first direction and the first length greater than the first width. The second contact element may be substantially rectangular in shape having a second length in the second direction and a second width in the first direction, the second length greater than the second width.

In a further embodiment, the second length is between approximately 2 and 3 times greater than the second width. In an embodiment, the first gate extends in the first direction. In an embodiment, a top surface of the second contact element interfaces the metallization layer. In an embodiment, a bottom surface of the second contact element interfaces the first contact element. In an embodiment, the second contact element extends over the first gate, an interlayer dielectric material interposing the second contact element and the first gate.

In another of the broader embodiments discussed herein a method is describes that provides for fabricating a semiconductor device such as a memory device. The method includes forming a first gate structure and a first source/drain region and forming a first contact interfacing the first source/drain region. After forming the first contact, the method includes depositing an interlayer dielectric over the first contact and etching a substantially rectangular shaped opening in the interlayer dielectric. A second contact is formed interfacing the first contact and in the substantially rectangular shaped opening. The method also includes forming a first metallization layer over the second contact.

In a further embodiment, the first metallization layer is formed directly on the second contact and extends along a long axis of the second contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a static random-access memory (SRAM) device including a pass gate (PG) transistor, a pull-down (PD) transistor, and a pull-up (PU) transistor;
    a first gate line of the PG transistor, a second gate line of the PD transistor and the PU transistor, wherein the first gate line and the second gate line extend in a first direction;
    a common source/drain region of the PG transistor, PD transistor, and PU transistor interposing the first gate line and the second gate line;
    another source/drain region of the PG transistor;
    a first contact extending from the common source/drain region and a second contact extending from the another source/drain region;
    a third contact disposed above the second contact, the third contact having a shape with a first width in the first direction and a first length in a second direction, the second direction being perpendicular to the first direction and the first length being greater than the first width; and
    a fourth contact disposed above the first contact, the fourth contact having a substantially rectangular shape in a plan view and a via extending from the fourth contact to a third gate line of the SRAM device.

2. The semiconductor device of claim 1, wherein the third contact directly interfaces the second contact and an overlying metallization layer.

3. The semiconductor device of claim 1, wherein the first length is approximately 2 to 3 times the first width.

4. The semiconductor device of claim 3, wherein the first contact has a second length greater than a second width of the first contact, and the second contact has a third length greater than a third width of the second contact, wherein the second and third lengths extend in the first direction.

5. The semiconductor device of claim 1, wherein the third gate line is associated with another PU transistor and another PD transistor of the SRAM device.

6. The semiconductor device of claim 1, further comprising;
    a third source/drain region of the PD transistor, the second gate line interposing the common source/drain region and the third source/drain region;
    a fifth contact extending from the third source/drain region, wherein the fifth contact is substantially rectangular in shape having a long axis in the first direction; and
    a sixth contact above the fifth contact to a first metallization line, wherein the sixth contact is substantially rectangular in shape having a long axis in the second direction.

7. The semiconductor device of claim 1, wherein a termination edge of the third contact is a first distance from a plane extending from a nearest edge of the first contact.

8. The semiconductor device of claim 7, wherein the termination edge is above the first gate line.

9. The semiconductor device of claim 1, wherein the first contact, the second contact and the third contact each include tungsten.

10. The semiconductor device of claim 1, wherein a top surface of the first contact and a top surface of the second contact are coplanar.

11. A semiconductor memory device, comprising:
a pass gate transistor including a first gate and a first source/drain region formed over a substrate;
a first contact element extending from the first source/drain region, wherein the first contact element is substantially rectangular in shape having a first length in a first direction and a first width in a second direction, the second direction substantially perpendicular to the first direction and the first length greater than the first width, wherein the first direction and the second direction are each parallel a top surface of the substrate;
a second contact element having a direct physical interface with the first contact element and extending above the first contact element, wherein the second contact element is substantially rectangular in shape having a second length in the second direction and a second width in the first direction, the second length greater than the second width, wherein the second length extends from a first terminal end to a second terminal end of the second contact element; wherein the second contact element extends over the first gate, an interlayer dielectric material interposing the second contact element and the first gate; and
a metallization layer over and having a direct physical interface with the second contact element including over the first terminal end and the second terminal end.

12. The semiconductor memory device of claim 11, wherein the second length is between approximately 2 and 3 times greater than the second width.

13. The semiconductor memory device of claim 12, wherein the first gate extends in the first direction.

14. The semiconductor memory device of claim 11, wherein a top surface of the second contact element has the direct physical interface with the metallization layer including an uppermost point of the first terminal end and an uppermost point of the second terminal end of the second contact element.

15. The semiconductor memory device of claim 14, wherein a bottom surface of the second contact element interfaces the first contact element.

16. The semiconductor memory device of claim 11, wherein the second contact element has a terminal edge over the first gate.

17. A semiconductor device, comprising:
a static random-access memory (SRAM) device including a pass gate (PG) transistor, a pull-down (PD) transistor, and a pull-up (PU) transistor;
a first gate line of the PG transistor, a second gate line of the PD transistor and the PU transistor, wherein the first gate line and the second gate line extend in a first direction;
a common source/drain region of the PG, PD, and PU transistor interposing the first gate line and the second gate line and on a first side of the first gate line;
another source/drain region of the PG transistor on a second side of the first gate line;
a first contact extending from the common source/drain region and a second contact extending from the another source/drain region;
a third contact disposed above the second contact, the third contact having a shape with a first width in the first direction and a first length in a second direction, the second direction being perpendicular to the first direction and the first length being greater than the first width;
a fourth contact disposed above the first contact, the fourth contact having a substantially rectangular shape and a via extending from the fourth contact to a third gate line of the SRAM device; and
a first metallization line above and directly interfacing a surface of the third contact and the first metallization line extending in the second direction.

18. The semiconductor device of claim 17, wherein the first contact and the second contact are rectangular and have a long side extending in the first direction.

19. The semiconductor device of claim 1, wherein the third contact has a terminal edge disposed over the first gate line.

20. The semiconductor device of claim 17, wherein the fourth contact includes tungsten.

* * * * *